United States Patent [19]

Larson et al.

[11] Patent Number: 5,550,006

[45] Date of Patent: Aug. 27, 1996

[54] PHOSPHATING COMPOSITIONS AND PROCESSES, PARTICULARLY FOR USE IN FABRICATION OF PRINTED CIRCUITS UTILIZING ORGANIC RESISTS

[75] Inventors: Gary B. Larson, Cheshire; Brian Jobson, Wolcott; James A. Johnson, Litchfield, all of Conn.; Lance C. Sturni, Allison Park, Pa.

[73] Assignees: MacDermid, Incorporated, Waterbury, Conn.; PPG Industries, Inc., Pittsburgh, Pa.

[21] Appl. No.: 243,189

[22] Filed: May 13, 1994

Related U.S. Application Data

[62] Division of Ser. No. 2,922, Jan. 11, 1993.

[51] Int. Cl.$^6$ ............................................. G03F 7/00
[52] U.S. Cl. .................... 430/311; 430/327; 205/188; 205/197
[58] Field of Search .................... 430/311, 314, 430/318, 327; 204/181.3, 181.6, 181.7; 205/188, 197

[56] References Cited

U.S. PATENT DOCUMENTS

| | | | |
|---|---|---|---|
| 1,254,263 | 1/1918 | Oeschgr | 148/262 |
| 1,947,122 | 2/1934 | Burdick | 148/262 |
| 2,233,422 | 3/1941 | Lodeesen | 148/6 |
| 2,272,216 | 2/1942 | Lodeesen et al. | 148/6 |
| 2,332,209 | 10/1943 | Engerst | 148/262 |
| 3,261,723 | 7/1966 | Croig | 148/262 |
| 3,269,877 | 8/1966 | Schlossberg et al. | 148/6.15 |
| 3,515,600 | 6/1970 | Jones | 148/262 |
| 3,645,797 | 2/1972 | Lorin | 148/6.15 R |
| 3,764,400 | 10/1973 | Caule | 148/6.16 |
| 3,833,433 | 9/1974 | Caule | 156/3 |
| 3,892,646 | 7/1975 | Lazzarini et al. | 204/181 |
| 4,378,270 | 3/1983 | Brasch | 252/147 |
| 4,592,816 | 6/1986 | Emmons et al. | 204/180.6 |
| 4,746,399 | 5/1988 | Demmer et al. | 156/656 |
| 4,751,172 | 6/1988 | Rodriguez et al. | 430/314 |
| 4,861,438 | 8/1989 | Banks et al. | 204/15 |
| 5,030,373 | 7/1991 | Kimura | 252/79.4 |
| 5,098,517 | 3/1992 | Tytgat | 156/666 |
| 5,221,370 | 6/1993 | Jo | 148/262 |
| 5,232,815 | 8/1993 | Browne | 430/191 |
| 5,288,377 | 2/1994 | Johnson | 204/181.3 |

FOREIGN PATENT DOCUMENTS

| | | |
|---|---|---|
| 2422732 | 4/1978 | France . |
| 293312 | 2/1971 | U.S.S.R. . |
| 1194826 | 6/1970 | United Kingdom . |

*Primary Examiner*—Kathleen Duda
*Attorney, Agent, or Firm*—St. Onge Steward Johnston & Reens

[57] ABSTRACT

Composition and methods for providing a phosphate conversion coating on a metal surface, particularly a copper surface, characterized in that the phosphating composition includes at least one composition-soluble compound containing vanadium, niobium, tungsten or tantalum. The phosphate conversion coatings so produced are thicker, more durable and more uniform than those produced by known phosphating compositions. The compositions and processes are especially useful for providing a passivating/uniformizing coating layer on copper surfaces to which organic resin is thereafter deposited to serve as a resist in printed circuit fabrication sequences, particularly when the organic resin is an electrophoretically deposited organic resin. Also described is the microetching of copper surfaces with a phosphoric acid/peroxide microetchant preparatory to deposit thereon (or after a further provision of a phosphate conversion coating) of a photoresist which is then imagewise exposed and developed to provide a patterned resist.

7 Claims, No Drawings

5,550,006

PHOSPHATING COMPOSITIONS AND PROCESSES, PARTICULARLY FOR USE IN FABRICATION OF PRINTED CIRCUITS UTILIZING ORGANIC RESISTS

This is a divisional of application Ser. No. 08/002,922 filed on Jan. 11, 1993, pending.

BACKGROUND OF THE INVENTION

The present invention relates to compositions for providing phosphate conversion coatings on metal surfaces; processes for providing phosphate conversion coatings on metal surfaces, particularly copper; and the use of such compositions and processes in connection with sequences for fabricating printed circuits in which organic resists are utilized, and most particularly sequences in which electrophoretically deposited organic resins are employed as resists.

The provision of phosphate conversion coatings on metal surfaces is a well known surface treatment procedure. These coatings, which are formed in place on the surface of the metal substrate and incorporate metal ions dissolved from the surface, are known for use as undercoatings for paints applied, e.g., to zinc or iron or aluminum, as well as for use in forming, or aiding the formation of, corrosion-resistant surfaces. Typical commercial phosphating compositions comprise one or more metal phosphates (e.g., alkali metal phosphates) dissolved in phosphoric acid.

A recent advance in the fabrication of printed circuits also makes use of phosphate conversion coatings to passivate and uniformize copper surfaces prior to electrophoretic deposition thereon of organic resins to serve as resists (e.g., etch resists, plating resists) in printed circuit fabrication sequences. That advance proceeded from the recognition of fundamental problems encountered in the known use of electrophoretically depositable organic resins as resists on copper surfaces, such as localized insufficient protection of copper surfaces from etching when the resins are utilized as etch resists, and variable and inconsistent imaging and development properties when the resins are applied as photoresists. In turn, it was discovered that these problems were traceable to substantial non-uniformity of deposited resin layer thickness, density and consolidation. Still further, it was discovered that this non-uniformity was traceable to random, non-uniform oxidation of the exposed copper surfaces over which the resins are applied in printed circuit fabrication. At the time of electrophoretic deposition, then, the copper surfaces exhibit substantial non-uniformity in resistivity/conductivity characteristics; since the rate of electrophoretic deposition is proportional to the voltage difference between the applied voltage and that of the surface to which it is being deposited, point-to-point non-uniformity of the resistivity/conductivity properties of the copper surface can lead to substantial non-uniformity of thickness, density and consolidation of the resin layer applied thereon. In extreme cases, the deposited resin layer may be so thin in localized areas (sometimes to the point of being essentially non-existent, as in the form of a pinhole defect) as to afford insufficient protection to the underlying copper surface (e.g., against etching solutions), or may be so thick in localized areas as to make impossible the imaging and development needed to provide the desired resist patterns.

The recent advance in this regard involves the provision of the copper surfaces, prior to electrophoretic deposition of organic resin thereon, with a uniformizing/passivating coating, i.e., a coating which passivates the copper surfaces against random, non-uniform oxidation, and which substantially uniformizes the surfaces with respect to their resistivity/conductivity characteristics. In this manner, it becomes possible to apply to these surfaces a layer of electrophoretically deposited resin which, in its thickness, density and consolidation properties, is of the uniformity which is required of resists in printed circuit fabrication sequences. One such useful passivating/uniformizing coating for the copper surfaces is a phosphate conversion coating.

As further work has been undertaken with respect to this recent advance in printed circuit fabrication, it was determined that yet further improvement could be obtained if the phosphate conversion coating itself could be improved in its ability to passivate the underlying copper surfaces and in its ability to provide surfaces of uniform resistivity/conductivity characteristics for subsequent electrophoretic deposition of resin thereon to serve as a resist in printed circuit fabrication. Specifically, it was found that known phosphate conversion coating compositions and processes often provide only a minimal conversion coating on the copper surfaces. Although even the provision of only a minimal phosphate conversion coating is still quite useful in the fabrication of printed circuits using electrophoretically deposited resins as resists (i.e., providing a far more uniform and passivated surface for such deposition as compared to the case in which no phosphate conversion coating is used at all), overall process improvement and process control would be attainable if there could be provided phosphating compositions and processes which consistently produce a more substantial and uniform phosphate conversion coating on the copper surfaces.

With this specific need in mind, there have been developed novel phosphating compositions and processes having particular utility in providing passivating/uniformizing coatings on copper surfaces to which organic resins are to be electrophoretically applied so as to serve as resists in printed circuit fabrication processes. Yet further, the phosphating compositions and processes so developed have utility in all environments in which phosphate conversion coatings traditionally are employed.

SUMMARY OF THE INVENTION

The primary object of the present invention is to provide compositions and processes for producing phosphate conversion coatings on copper surfaces.

Yet another object of the invention is to provide compositions and processes which produce on copper surfaces a phosphate conversion coating which is thicker, more durable and more uniform than has been heretofore possible using known compositions and processes.

Still further, it is an object of the invention to provide phosphating compositions and processes for converting copper surfaces to surfaces which are substantially passive to oxidation and which are substantially uniform in their resistivity/conductivity characteristics.

A further object of the invention is to provide processes for the fabrication of printed circuits, in which a phosphate conversion coating is provided on copper surfaces prior to application of organic resist thereon, particularly when the resist is provided as an electrophoretically deposited organic resin.

These, and other objects as will be apparent, are accomplished through the provision of aqueous phosphating compositions in which there is included, in addition to the essential components of a phosphating composition per se, at least one composition-soluble compound of an element selected from the group consisting of vanadium, niobium, tungsten and tantalum. The phosphate conversion coatings produced on copper surfaces by means of these compositions are characterized by improved thickness, improved durability and improved overall uniformity, including uniformity of resistivity/conductivity characteristics. As a consequence, the compositions provide on copper surfaces a phosphate conversion coating which is ideally suited to electrophoretic deposition on such surfaces of organic resin for use as a resist in a printed circuit fabrication process, and which also is suited for a number of other purposes.

Typically, the composition-soluble compound of the vanadium, niobium, tungsten or tantalum will be a compound in which the element is present as part of (and usually serving as the central element of) an oxoanion, such as the vanadates (e.g., $VO_3^-$; $VO_4^{-3}$), tungstates (e.g., $WO_4^{-2}$) niobates (e.g., $NbO_3^-$) and tantalates (e.g., $TaO_3^-$), and most typically in association with an alkali metal or alkaline earth metal element as the cation (e.g., sodium, potassium, etc.).

In addition to the above-noted compounds, the aqueous composition of the invention will contain the typical principal components of traditional phosphating compositions, in particular phosphoric acid, and may further contain any of the known additives for such compositions serving functions as sources of phosphate ion and/or pH adjusting or buffering agents and/or accelerators for speeding the conversion reaction (e.g., nitrites, nitrates, chlorates, peroxides, and the like) and/or composition-soluble sources of other metals. For producing the phosphate conversion coating, the applicable copper (which, as used herein, includes copper alloys or intermetallics) surfaces are brought into contact with the composition, such as by immersion or spraying, for the time necessary to provide a phosphate conversion coating of acceptable thickness, typically requiring anywhere from about 10 seconds to about 10 minutes depending upon the particular composition and its temperature (which may range from about 60° F. to about 200° F., more typically 120° F. to 160° F.).

As noted, the invention also provides improved processes for the fabrication of printed circuits, which processes are of the general type in which an organic resist is applied over a copper surface, and most particularly in fabrication processes in which an organic resin is electrophoretically deposited over a copper surface to serve as a resist (e.g., plating resist, etch resist). In the improved processes, the copper surfaces, prior to the application of organic resist thereon, are first provided with a substantially uniform layer of a phosphate conversion coating utilizing the phosphating composition of the invention, and thereafter the organic resist is applied over the phosphate conversion coating.

DETAILED DESCRIPTION OF THE INVENTION

As has previously been discussed, an important aspect of the present invention is the provision of printed circuit fabrication processes utilizing electrophoretically deposited organic resins as resists for selected copper surfaces, with the phosphating compositions of the invention being used to provide a passivating/uniformizing coating on the copper surfaces before the electrophoretic deposition of resin thereon. Accordingly, the invention herein is first described with reference to this environment for its use.

In the manufacture of printed circuits, it is well known to employ organic resists in the manufacturing sequence. For example, organic resists are often provided in a preselected pattern over a copper-covered dielectric substrate to serve as a selective plating resist, whereby a subsequent metallization step selectively further metallizes only those copper areas not covered by the resist material. Also well known is the provision of organic resists in a preselected pattern over a copper-covered dielectric substrate to serve as a selective etch resist, where a subsequent metal etching step selectively etches away only those copper areas not covered by the resist material.

The desired pattern of organic resist can be achieved by selective application of the resist composition to the copper surface through a suitably patterned mask or by photoimaging techniques. In the latter, the photoactive resist composition is applied as a layer to the copper surface and is then imagewise exposed to activating radiation of appropriate wavelength through a mask. Depending upon the nature of the photoactive composition, i.e., whether it is positive-working or negative-working, subsequent development of the composition will result in the leaving behind on the copper surface of a pattern of organic resist corresponding to the negative or positive, as the case may be, of the light-exposure pattern.

It also is known to employ as organic resists compositions which can be electrophoretically deposited over conductive (i.e., copper) surfaces. These resist compositions can be photoactive or non-photoactive. For the former, electrophoretic deposition is used to provide a layer of the composition to the copper surface, following which imagewise exposure and development result in the desired organic resist pattern. For the latter, the surface in question is already present in a pattern of conductive and non-conductive surfaces (such as is the case when a copper surface has been previously selectively patterned with a plating resist which remains temporarily in place), and the electrophoretic deposition of resist results in its selective application only to exposed conductive surfaces.

The use of electrophoretically depositable resins as resists in the manufacture of printed circuits provides a number of advantages to the manufacturer. By their nature, they are capable of selective deposition onto only the exposed conductive surfaces of a substrate already patterned in conductive and non-conductive surfaces, and thus provide the manufacturer with an easy means for selectively depositing resin to serve, e.g., as an etch resist for underlying copper areas in the manufacturing sequence. Even when the selective depositing property is not required, such as when the resin is a photoactive resin which will simply be deposited as a layer and subsequently exposed and developed in a pattern, electrophoretic deposition provides an easy means (in substitution for roller coating, curtain coating, etc.) for depositing the resin layer, and particularly for providing the resin as a very thin layer (e.g., 0.2 to 0.5 mil thickness) suitable when very fine line circuitry traces are desired.

In the previously discussed recent advance in this art, it was found that for all situations in the course of manufacture of a printed circuit where an organic resin is to be electrophoretically deposited onto a copper surface to serve as a resist, significant advantage can be realized if the copper surface is preliminarily treated to provide a phosphate conversion coating thereon, over which the organic resin is then electrophoretically deposited. In the present invention, yet further improvement and advantage is realized through use of a particular phosphate conversion coating, i.e., one provided by a phosphating composition containing at least one composition-soluble compound having an element selected from the group consisting of vanadium, niobium, tungsten and tantalum.

As with the noted recent advance in the art, the improved process of the present invention is applicable in any or all of those situations in the course of printed circuit manufacture wherein an organic resin is to be deposited over a copper surface by electrophoresis to serve as a resist. While there are a vast number of different processes for manufacturing printed circuits using resists over copper surfaces, a few exemplary processes are discussed hereinafter as indicative of the breadth of the improved technique.

In the manufacture of printed circuit boards which do not contain metallized through-holes, as is generally the case for the manufacture of the innerlayer circuits for later use in fabrication of a multilayer printed circuit, the starting material is a dielectric substrate material having a coating of copper thereon (typically in the form of a copper foil cladding bonded to the dielectric substrate surface). The desired pattern of conductive circuitry is arrived at through use of photoimaging and etching techniques. In the context of electrophoretic deposition, then, an electrophoretically depositable photoimageable organic resin composition is deposited as a layer over the copper surface by electrophoresis. The layer is then imaged and developed to provide a resist in the pattern of the desired circuitry. Thereafter, the board is subjected to a copper etching process, whereby all copper not protected by the etch resist is etched away down to the substrate surface. Upon removal of the etch resist, there remains copper in the desired pattern.

In the known processes of this type, the copper surfaces to which the photoresist layer is to be electrophoretically applied are preliminarily cleaned to remove contaminants therefrom prior to the electrophoretic deposition, such as by cleaning to remove organic contaminants, chemical microetching and/or mechanical abrasion to remove inorganic contaminants such as oxides, and other like processes. In accordance with the earlier-described recent advance in this art, it was found that in these known electrophoresis processes, the layer of electrophoretically depositable photoresist so applied is often not uniform in thickness or in properties, sometimes even to the point of having pinhole defects therein. It was theorized that this non-uniformity results from the fact that the cleaned copper surface onto which the resin is electrophoretically deposited is thermodynamically highly unstable and thus undergoes rapid and non-uniform surface oxidation before the resist layer can be electrophoretically deposited thereover. As a result, the surface over which the resist layer is deposited is neither physically uniform nor uniform in its conductivity/resistivity, and the resist layer deposited thereover correspondingly is also not uniform in thickness or properties. In this particular situation, i.e., in which photosensitive electrophoretically deposited resin is used as an etch resist, there are at least two disadvantageous consequences of this resin layer non-uniformity. First, problems may be encountered in the time and/or conditions necessary to achieve the imagewise exposure and development required to provide the desired etch resist pattern. Second, as to the etch resist so produced, its non-uniformity can result in certain areas thereof affording insufficient protection to the copper areas thereunder during the copper etching step (particularly so if the non-uniformity involves or includes pinhole defects); undesired etching of copper areas can, of course, lead to opens, shorts and other defects.

In the recent advance in the art, upon which the method of the present invention provides improvement, the copper surfaces to which the photoimageable resin layer is to be electrophoretically applied in the foregoing manufacturing process are first treated to provide them with a phosphate conversion coating. Apart from thereby passivating the copper surfaces so as to prevent any random non-uniform oxidation prior to the electrophoretic deposition of the resin, the so-formed phosphate conversion coating renders the overall surface more uniform both physically and in terms of its conductivity/resistivity, thereby enabling the electrophoretically deposited resin also to be deposited as a substantially uniform layer, with substantially no defects, thus avoiding the problems earlier discussed with non-uniform resin layers.

Following the application of the resin layer by electrophoresis over the phosphate conversion coating on the copper surfaces, and imaging and development, the copper areas not protected by the resist are then etched away down to the substrate surface. Most commonly employed copper etchants will be effective in also etching the phosphate coating over the copper.

The provision of a phosphate conversion coating on copper surfaces over which a resist will be electrophoretically deposited, in accordance with the recent advance in the art and the present improvement over it, has applicability to any number of printed circuit manufacturing processes employing resists either as plating and/or etch resists, and whether or not the resist is one which is produced by photoimaging.

By way of further example in this regard, the invention also is applicable in processes for manufacturing printed circuits containing metallized through holes, such as for double-sided printed circuits; outer-facing circuitry layers of multilayer printed circuits; and innerlayer circuits for those multilayer printed circuits which are to have buried through holes. In a typical process of this type, the copper-clad dielectric or multilayer composite has through-holes drilled therein, and the through-holes are metallized by, e.g., electroless copper depositing. The electrolessly copper plated through-holes and board surfaces can be further built up in copper thickness by means of further electroless or, more typically, electrolytic copper depositing. To this end, the board is photoimaged to provide a pattern of plating resist thereon (i.e., in the negative of the desired circuitry areas) before the additional plating so as to avoid plating copper areas which will eventually be etched away. In the context of this invention, the resist so employed can, if desired, be a photoimageable electrophoretically depositable resist which is applied as a layer over the electroless copper surfaces and then imagewise exposed and developed. By first providing on the electroless copper surfaces a uniform phosphate conversion coating according the invention, the resin layer is electrophoretically depositable as a layer of substantially uniform thickness, with the attendant advantage of uniformity in the imaging and developing steps.

Irrespective of the resist employed as the plating resist (i.e., electrophoretically depositable; dry film; liquid photoresist), the areas under the resist are then required to be etched away without etching away the built up copper areas which will form the copper circuitry. To this end, electrophoretically depositable organic etch resists are ideally suited since they can be selectively applied to the built up copper areas, and not over the plating resist, much in the same way as is possible with the electroplated tin and/or lead etch resists conventionally employed in the art. Obviously for this purpose the electrophoretically depositable organic resist need not be photoimageable. In accordance with the invention, the built up copper areas are first provided with a uniform phosphate conversion coating before the etch resist is electrophoretically applied thereover, in this way enabling deposition of a resist of uniform thickness and properties and substantially without any pin hole defects. The resist thus serves well to protect the built up copper from etching.

Following the electrophoretic deposition of etch resist, the plating resist is removed and the copper thereunder etched away down to the substrate surface. Thereafter, the etch resist can be removed, leaving the desired surface pattern of built-up copper circuitry.

The novel phosphating compositions which are utilized to provide the requisite phosphate conversion coating on copper surfaces in these printed circuit fabrication sequences comprise aqueous solutions whose key ingredient, apart from phosphoric acid per se, is a composition-soluble compound (or mixture of such compounds) of an element selected from the group consisting of vanadium, niobium, tungsten and tantalum, most typically and preferably a compound in which the element is the central atom of an oxoanion, such as is the case for vanadates, niobates, tungstates and tantalates. Most preferred are the compounds which employ an alkali metal or alkali earth metal as the cation, such as for example, $NaVO_3$, $Na_3VO_4$, $K_2WO_4$, $NaNbO_3$, $NaTaO_3$, and the like.

Stated in other terms, the novel compositions of the invention can be those which result simply by incorporation of the composition-soluble vanadium, niobium, tungsten or tantalum compound, or mixtures thereof, in any known composition for providing a phosphate conversion coating on copper surfaces. Most typically, such known compositions are based upon buffered phosphoric acid solutions, with numerous optional ingredients for obtaining special processing or coating advantages or effects, and the improvement herein resides in the inclusion in such compositions of the V, W, Nb or Ta compound. In this regard, reference may be had to the teachings of, e.g., U.S. Pat. Nos. 2,233,422; 2,272,216; 3,269,877; 3,645,797; 3,764,400; and 3,833,433, for known phosphating compositions for copper, and whose teachings are expressly incorporated herein by reference. Reference also may be had to Volume 15, pp. 301–309, of the Kirk-Othmer Encyclopedia of Chemical Technology, (3rd ed. 1981), also incorporated herein by reference.

Typically, the concentration of the composition-soluble vanadium, niobium, tungsten or tantalum compound or compounds in the phosphating composition will be on the order of from about 0.1 to about 200 g/l, more preferably from about 1 to about 50 g/l, and most preferably from about 1 to about 5 g/l. The compositions typically are acidic, and preferably will have a pH in the range of from about 1 to about 6, more preferably from about 4 to about 6.

The copper surfaces contacted with the phosphating composition to provide the requisite phosphate conversion coating thereon will typically be cleaned before such contact to remove contaminants from the surfaces, such as organics, oxides, and the like, by means of cleaning solutions, copper micro-etchants (e.g., peroxide/sulfuric acid solutions) and, less preferably, mechanical scrubbing or abrasion techniques. Thereafter, the copper surfaces should be rinsed and then contacted with the phosphating composition as soon as possible.

Following the formation of the phosphate conversion coating using the composition of this invention, the entire substrate typically will be rinsed with water before organic resist material is electrophoretically deposited on the applicable copper surfaces. While it is generally good practice to avoid long holding periods between phosphate conversion coating formation and resist deposition, it is a distinct advantage of this invention that since the phosphate conversion coating serves to passivate the copper surfaces against further random oxide formation in air, the operating window between the controlled formation of the uniform phosphate conversion coating and the time when resist must be deposited is greatly increased.

The electrophoretic deposition of resist over the uniformized copper surfaces (having a phosphate conversion coating thereon) can be carried out with any suitable electrophoretically depositable organic resin and under any suitable depositing conditions known in the art. As already noted, depending upon the printed circuit manufacturing sequence, the electrophoretic deposition may be such as to deposit a layer of a photoactive resin (which is then imaged and developed to produce the desired resist pattern for use as a plating or etch resist ) or to selectively and directly deposit resin (e.g., as an etch resist) over the conductive surfaces of a board having an existing pattern of conductive and non-conductive surfaces.

In general, the electrophoretic deposition is carried out in a cell containing a solution or emulsion of the organic resin, and most typically the copper surfaces, on which the phosphate conversion coating has been formed, serve as the cathode in the cell (positively-charged organic resin). The temperature at which the electrophoretic deposition is carried out generally will be between about 70° F. to about 100° F., and the voltage typically will be in the range of from about 20 to about 300 volts. The electrophoretic deposition of the resin continues until the desired thickness of resin is obtained. Generally, the thickness will be on the order of from about 0.2 to about 2.0 mil depending upon the type of resist (e.g., plating or etch) and the type of circuitry involved, but any optimal and desired thickness can be employed.

For further particulars regarding electrophoretic resin coatings in the specific context of printed circuit fabrication sequences, reference may be had to USSR Inventor's Certificate No. 293,312 (published May 10, 1971); British Patent Specification No. 1,194,826 (published Jun. 10, 1970); French Patent Application 2,422,732; and U.S. Pat. No. 3,892,646 to Lazzarini et al; U.S. Pat. No. 4,592,816 to Emmons et al; U.S. Pat. No. 4,746,399 to Demmer et al; U.S. Pat. No. 4,751,172 to Rodriquez et al; and U.S. Pat. No. 4,861,438 to Banks et al. The foregoing references, and particularly the extensive discussion in a number of them of various types of polymer resins which can be deposited by electrophoresis (e.g., cationic polymers depositable on the surface of a negatively charged substrate (cataphoresis) and anionic polymers deposited on the surface of a positively charged substrate (anaphoresis)), are incorporated herein by reference.

As was noted at the outset, the advantage of the novel phosphating compositions in this context of printed circuit fabrication sequences using electrophoretically deposited organic resins as resists for copper surfaces, is that the compositions consistently provide phosphate conversion coatings which are thicker, more durable and more uniform (particularly in resistivity/conductivity characteristics) than has heretofore been possible using known phosphating compositions. As a consequence, the coated copper surfaces over which there will be electrophoretically deposited an organic resin to serve as a resist, are strongly passivated against any problematic random, non-uniform oxidation prior to the electrophoretic resin application, and are highly uniform in resistivity/conductivity characteristics, thereby leading to a resin deposit which is highly uniform in its thickness, density and consolidation properties and which thus possess the characteristics required for resists in printed circuit fabrication sequences.

These same characteristics and advantages of the phosphating composition of the invention, i.e., production of a phosphate conversion coating on copper which is thicker, more durable and more uniform than heretofore possible, also renders the compositions extremely useful in any situation in which a copper surface is to be provided with a phosphate conversion coating for any purpose, be it to improve adhesion to the copper surfaces of permanent coatings, or to improve corrosion resistance of copper surfaces, or the like.

In particular, the improved phosphate conversion coatings of the invention offer advantage in any printed circuit fabrication sequence in which a photoimageable organic resist is utilized in order to provide a resist pattern, i.e., including situations in which the photoresist is not one applied by electrophoretic deposition, but rather is, e.g., a dry film resist, or a liquid photoresist applied by roller coating, curtain coating, screening, or the like.

In such processes, the key feature is the application of the photoresist composition over surfaces, which are either wholly copper or include copper areas, in the form, e.g., of a uniform layer, followed by selective imagewise exposure and development so as to leave behind the desired resist pattern. Critical to the process is the attainment during development of complete removal of photoresist composition from areas where resist is not desired; depending upon the printed circuit fabrication sequence in question, if unwanted resist remains behind, copper areas which, e.g., are supposed to receive subsequent metal plating will not be plated, or areas from which copper is supposed to be etched away will resist the etching solution.

Problems are often encountered in this regard as the applied resist composition too tenaciously adheres to copper surfaces over which it is applied, to the point that its intended removal therefrom in the development step, after selected imagewise exposure, does not occur or occurs only with difficulty. According to the invention, by preliminarily providing the copper surfaces, over which the photoresist is to be applied, with a phosphate conversion coating of the invention before photoresist application, the copper surfaces are converted to surfaces which are quite uniform and relatively smooth. Photoresist applied over these surfaces, and them imagewise exposed and developed, is found to develop quite cleanly without need for excessively stringent development conditions, and without compromise of the adhesion of resist on those selected copper surfaces where it is intended to remain.

The invention is further illustrated and described with reference to the following examples.

EXAMPLE I

In this example, the improved phosphating composition of the invention is employed to provide a phosphate conversion coating on copper surfaces prior to electrophoretic deposition thereon of organic resin to serve as a resist in a printed circuit fabrication process, in comparison with the same process using a conventional phosphating composition.

A laminate having a reinforced epoxy resin core and clad with copper foil was processed as follows:

1. The foil surfaces were cleaned of organic impurities by soaking in a commercial cleanser [Metex T-103 at 75 g/l; MacDermid, Inc.] for 3 minutes at a temperature of about 140°–160° F., followed by water rinsing.

2. The foil surfaces were then microetched in a peroxide/sulfuric solution [MACuPREP ETCH G-5; MacDermid, Inc.] for about 2 minutes at a temperature of about 80° F. (effecting the removal of about 50 microinches of copper), followed by water rinsing.

3. The board was then immersed in a conventional phosphating solution, containing 17.6 g/l phosphoric acid, 6.9 g/l $Na_2CO_3$ and 0.5 g/l $Na_2MoO_4$ (pH=5.0–5.5), for about 3 minutes at a temperature of about 150° F., to provide on the copper foil surfaces a phosphate conversion coating, followed by water rinsing.

4. A 0.4 mil layer of photosensitive organic resin [Electro-Image 1000$^R$; PPG Industries] was then cataphoretically deposited over the phosphate conversion coating surfaces using an approximately 200 volt charge for about 30 seconds. Following drying, the layer of resin was exposed imagewise to activating radiation and developed to produce an etch resistant pattern of the resin.

5. Those phosphate-coated copper surfaces not protected by the resist pattern were etched away down to the dielectric layer using an ammoniacal etchant [ULTRA ETCH 50; MacDermid, Inc.], followed by stripping of the resist and rinsing and drying of the laminate.

Inspection of the so-processed laminate revealed that the resist was reasonably uniform in its thickness, density and consolidation and served to adequately protect the underlying copper surfaces from etching, particularly as compared to an identical process but without any provision of a phosphate coating. Nevertheless, it was determined that the applied resist was not as uniform as it could, at least in theory, be made to be. Energy Dispersive X-Ray Fluorescence Spectrometry (EDACS) analysis of a sample copper surface processed through the first three steps of the foregoing sequence in fact revealed that only minimal conversion coating had taken place (i.e., very little phosphorus was present on the copper surface) and that the coating itself was not entirely uniform.

Another copper clad epoxy laminate was then identically processed as per the above five-step sequence, but this time adding to the phosphating composition 1.0 g/l of sodium vanadate ($NaVO_3$). Inspection of the so-processed laminate revealed that the resist so applied was extremely uniform in its thickness (no more than ±1 micron variation in thickness), density and consolidation. EDACS analysis of a sample copper surface processed through the first three steps of the sequence revealed that a much thicker and more uniform, continuous phosphate conversion coating had been produced on the copper surface than was the case using the conventional phosphating composition.

As noted earlier, and as reflected in the foregoing example, copper surfaces which are to be provided with the phosphate conversion coating according to the invention typically and preferably will first be cleaned and microetched before contact with the phosphating composition, with microetching typically being effected using a traditional copper microetchant, e.g., peroxide/sulfuric acid solution. In accordance with a preferred aspect of the invention, it has been found that further advantage can be realized by utilizing as the copper microetchant a phosphoric acid/peroxide solution rather than a conventional sulfuric acid/peroxide microetchant. In particular, when copper surfaces are microetched in this manner, followed by provision thereon of a phosphate conversion coating according to the invention, followed by application over the surfaces of a photoresist composition requiring imagewise exposure and development, the development occurs even more easily and in an extremely clean manner such that no unwanted resist remains in areas from which it is intended to be removed in development, and without compromise of the adhesion of resist to selected copper surfaces where it is desired for resist to remain.

In this embodiment of the invention, the microetchant composition will comprise an aqueous solution preferably containing from about 2–15% by weight phosphoric acid (based upon an 85% phosphoric acid stock solution), more preferably 5–10% by weight, and 0.5–15% by weight peroxide (based upon a 50% hydrogen peroxide stock solution), more preferably 3–5% by weight, together with optional peroxide stabilizers and/or etch rate enhancers as known in the art for sulfuric acid/peroxide microetchants, and used under essentially the same conditions as known for the conventional sulfuric acid/peroxide microetchants.

This aspect of the invention is illustrated in the following example in connection with an electrophoretically deposited photoimageable organic resin.

EXAMPLE II

A laminate having a reinforced epoxy resin core and clad with copper foil was processed in accordance with the Example I illustration of the invention (i.e., using the phosphating composition containing an added 1.0 g/l of sodium vanadate), but with substitution at step 2. of a microetchant containing 8% by volume of 85% phosphoric acid and 3% by volume of 50% hydrogen peroxide in place of the MACuPREP ETCH G-5. Upon development, the unexposed resist composition was exceptionally easy to remove in a uniform manner, with no incidence of unwanted residual resist. While clean resist removal during development is achievable and was achieved in the comparative sequence using the sulfuric acid/peroxide copper microetchant, the improved sequence using the phosphoric acid/peroxide microetchant was somewhat more foolproof in this regard and did not require any undue care or attention to development removal as might otherwise be the case in sequences using the conventional microetchant.

The foregoing preliminary preparation of copper surfaces before provision thereon of a phosphate conversion coating and a photoresist composition brings about improved resist removal during development even in those situations where a conventional phosphating composition is employed, i.e., one without the presence of the vandium, niobium, tungsten and/or tantalum compound as per the invention therein. Thus, while the improved phosphating compositions are of course preferred, particularly for arriving at exceptionally uniform surfaces leading to electrophoretically deposited organic resins which are highly uniform in thickness, density and consolidation, advantage can be realized in facilitated resist removal during development irrespective of the phosphating composition employed.

Still further in this regard, it has been determined that the treatment of copper surfaces with the phosphoric acid/peroxide microetchant has advantage, relative to application and development of a photoresist composition, even in situations in which the photoresist composition is applied directly over the microetched surfaces, i.e. , without first providing the phosphate conversion coating on the copper surfaces. This is particularly so when the photoresist is not one which is applied by means of electrophoretic deposition.

This embodiment of the invention, then, is applicable to any printed circuit fabrication process in which a photoresist composition is applied over copper surfaces, followed by imagewise exposure and development of the composition so as to selectively remove the composition from selected copper surface areas and leave behind the desired pattern of resist. In such processes, the copper surfaces over which the photoresist composition is applied are microetched with the phosphoric acid/peroxide microetching composition, and the photoresist composition then applied directly on the so-microetched copper surfaces. As compared to an identical sequence but using a conventional sulfuric acid/peroxide microetchant for the copper, it is found that removal from the copper surfaces of the selected portions of the photoresist during development is greatly facilitated, i.e., with little or no incidence of situations where the composition so tenaciously adheres to the copper surfaces as to make removal difficult or to risk leaving behind resist at areas where none is desired.

As noted, this aspect of the invention is particularly well suited for printed circuit fabrication sequences, or portions of such sequences, where the photoresist composition is other than one applied by electrophoretic deposition, such as for dry film photoresist or liquid resist applied by, e.g., roller coating, curtain coating, screening or other like method, since for these photoresists it is not critical that the copper surfaces over which they are applied exhibit the uniformity of resistivity/conductivity properties which is ideally required for electrophoretically applied resist compositions and which can be realized through the provision of phosphate conversion coating before electrophoretic deposition of resin.

The foregoing aspect of the invention is illustrated in the following example.

EXAMPLE III

A laminate having a reinforced epoxy resin core and clad with copper foil was processed in accordance with Steps 1 and 2 of the sequence shown in Example I, followed by lamination to the microetched copper foil of a dry film photoresist and imagewise exposure and development of the photoresist. Another laminate was identically processed, but with use in Step 2 of a copper microetchant containing 8% by volume of 85% phosphoric acid and 3% by volume of 50% hydrogen peroxide (i.e., in place of the sulfuric acid/peroxide MACuPREP ETCH G-5). In comparison, the sequence using the phosphoric acid/peroxide microetchant exhibited a greater ease of, and cleaner, removal of the unexposed photoresist during development.

It will be appreciated that the foregoing is provided in description and illustration of the invention and preferred embodiments thereof, and that numerous other variations and modifications are contemplated within the scope and spirit of the invention, as defined by the appended claims.

What is claimed is:

1. A method for producing a phosphate conversion coating on the surface of metal, said process comprising contacting said surface with an aqueous phosphating composition which comprises phosphoric acid and at least one composition-soluble compound containing an element selected from the group consisting of vanadium, niobium, tungsten and tantalum for a time effective to produce a phosphate conversion coating on said metal surface.

2. A method according to claim 1 wherein said metal comprises copper.

3. A method according to claim 2 wherein said contacting is for a time in the range of from about 10 seconds to about 10 minutes.

4. A method according to claim 3 wherein the temperature of said aqueous phosphating composition is from about 60° F. to about 200° F.

5. A process according to claim 2 wherein said copper surface upon which is provided said phosphate conversion coating over which said organic resin is deposited is a copper foil affixed to a substrate surface.

6. A process according to claim 2 wherein said copper surface is microetched before formation thereon of said phosphate conversion coating.

7. A process according to claim 6 wherein said copper surface is microetched by contact thereof with an aqueous solution comprising phosphoric acid and hydrogen peroxide.

* * * * *